United States Patent [19]

Voegeli

[11] 4,023,150
[45] May 10, 1977

[54] BUBBLE TRANSLATION SYSTEM
[75] Inventor: Otto Voegeli, San Jose, Calif.
[73] Assignee: International Business Machines Corporation, Armonk, N.Y.
[22] Filed: Dec. 15, 1975
[21] Appl. No.: 640,518
[52] U.S. Cl. .......................................... 340/174 TF
[51] Int. Cl.² ................... G11C 11/14; G11C 19/00
[58] Field of Search .............. 340/174 TF, 174 PD, 340/174 SB, 174 TL, 174 CS

[56] References Cited
UNITED STATES PATENTS

| | | | |
|---|---|---|---|
| 3,513,452 | 5/1970 | Bobeck et al. | 340/174 TF |
| 3,760,357 | 9/1973 | Inose et al. | 340/174 TF |
| 3,828,330 | 8/1974 | Parzefall | 340/174 TF |

Primary Examiner—Vincent P. Canney
Attorney, Agent, or Firm—Joseph E. Kieninger

[57] ABSTRACT

A bubble lattice translation system is disclosed. The system is a combination of two arrays of parallel conductors and confining means. One array of parallel conductors is oriented at an angle of 60° to the lattice translation axis. All of these conductors in this array are connected in parallel to a single current source. The other array of conductors is at an angle of −60° to the lattice translation axis. All of the conductors in the second array are connected in parallel to a second current source. The two conductor arrays exist in the same plane of metallization with no insulation required at conductor intersections. Positioned between the rows of bubbles in the lattice are confining means which define the lattice translation axis. The two conductor circuits are activated sequentially by bi-polar current drivers such as two sinusoidal current sources which are 90° out-of-phase. This translation system provides distributed drive on the bubble lattice, utilizing a single conductor level.

11 Claims, 7 Drawing Figures 4,023,150

BUBBLE TRANSLATION SYSTEM

FIELD OF THE INVENTION

This invention relates to bubble lattice devices and more particularly to a system for translating bubble lattices for data accessing.

DESCRIPTION OF PRIOR ART

Bubble domains arranged in a lattice are described in copending U.S. patent application, Ser. No. 395,336 filed Sept. 7, 1973 and Ser. No. 494,940 filed on Aug. 5, 1974 and assigned to the assignee of the present invention. The aforementioned applications are incorporated herewith by reference thereto. As described therein, the bubble lattice consists of a plurality of rows and columns of bubble domains which occupy a spatial arrangement which is determined to a substantial extent by the interaction between the bubbles.

Prior to this invention the only scheme used to any extent for lattice translation involved the use of widely separated current conductors to produce localized driving forces. This type of translation arrangement is described in the aforementioned U.S. patent application, Ser. No. 494,940. Typically, present current access lattice translation schemes use either two sequentially activated circuits with bi-polar drive or three circuits with unipolar drive. The drive conductors are aligned parallel with a lattice symmetry axis and oriented at 60° to the lattice translation axis.

While lattice translation schemes employing current conductors have been successfully used, such translation schemes do have certain disadvantages. For example, the heat generated by power dissipation in the localized drive conductors cause a non-uniform temperature distribution across the bubble material. Since the material characteristics are typically temperature sensitive, the operating margins are reduced. It is also been found that bubble lattices can be translated more efficiently and at a faster rate when more conductors are used. However, increasing the number of conductors involves the use of more interconnections and undesirably high voltages are required to drive the serially connected conductor circuits. In addition, fabrication defects that render a single conductor inoperative will cause the whole chip to be inoperative. In addition, transverse lattice distortions occur because the driving forces are applied at a fixed 30° angle to the translation axis and longitudinal distortions occur because the conductors are usually separated by several lattice constants.

A different current drive system, applicable to the propagation of isolated bubbles, has been discussed by Walsh and Charap in the AIP Conference Proceedings, No. 24, p. 550, 1 (1974). The system utilizes non-uniform current distributions in a perforated conducting sheet. In one case, perforations consist of T and I patterns and an azimuthally rotating drive current is used. In a second case, perforations consist of a square array of round holes and an oscillating drive current is used. Propagation is said to occur under asymmetric drive conditions on account of inertial bubble characteristics.

SUMMARY OF THE INVENTION

It is a primary object of this invention to provide an improved bubble lattice translation system.

It is another object of this invention to provide a lattice translation system having electrical circuits with low input impedance.

It is still another object of this invention to provide a translation scheme which produces a distributed rather than a localized driving forces on the lattice.

It is yet another object of this invention to provide a bubble translation scheme which produces a minimum of lattice distortion.

It is yet still another object of this invention to provide a translation system which produces minimal variations in local bubble velocities.

It is yet still another object of this invention to provide a translation scheme which is operative even when discontinuities or shorts are present in some conductors.

It is yet still another further additional object of this invention to provide a simplified translation scheme which can be fabricated within a single level of metallization.

These and other objects are accomplished by a translation system having a confining means which defines the lattice translation axis and two arrays of parallel conductors which intersect each other. The confining means, for example, a dam, restrict the bubble motion perpendicular to the lattice translation axis. In a preferred embodiment the confining means are dams which are positioned between all of the rows in the lattice. The first array of parallel conductors is positioned at an angle of 60° to the lattice translation axis. All of these conductors are connected in parallel to a first current source. A second array of parallel conductors is positioned at an angle of −60° to the lattice translation axis. The second array of parallel conductors is connected to a second current source. The first array of conductors crosses and intersects the second array of parallel conductors. The sources are connected to the arrays in such a manner that the two circuits are electrically orthogonal in that all current conductors of one circuit, that is one array, run along equal potential lines of the other circuit and vice versa. The two circuits are activated sequentially by bi-polar current drivers such as two sinusoidal current sources which are 90° out-of-phase.

Other objects of this invention will be apparent from the following detailed description, reference being made to the accompanying drawings wherein various embodiments of the invention are shown.

DESCRIPTION OF THE ILLUSTRATIVE EMBODIMENTS

Figure 1:
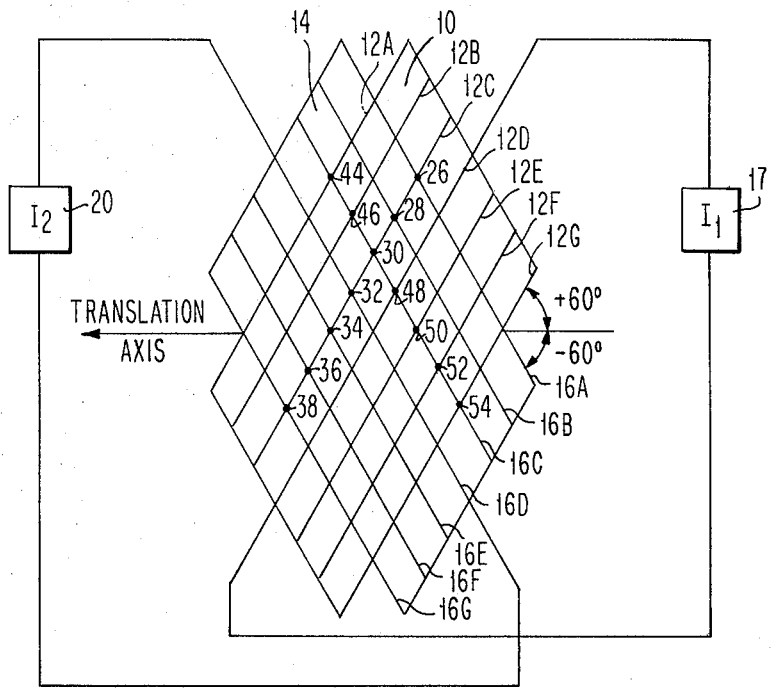
FIG. 1 is a top view showing the position of the first and second arrays of parallel conductors.

This invention is concerned with a bubble lattice translation scheme including confining means and a conductor pattern. Confining means are provided which define the lattice translation axis. The confining means restrict the bubble motion perpendicular to the axis. One array of parallel conductors is positioned at an angle of 60° to the lattice translation access. The second array of parallel conductors is positioned at an angle of −60° to the axis. The conductors of the first array intersect the conductors of the other array. The two conductor arrays are connected to their respective current sources in such a manner that electrically the two circuits are mutually orthogonal. This is the case because all current conductors of one circuit run along equal potential lines of the other circuit and vice versa. Consequently, no electrical insulation is required between the two circuits. The system in fact behaves the same whether or not such insulation is present. As shown in FIG. 1 an array 10 of parallel conductors 12A through 12G are aligned at an angle of 60° with the translation axis. Another array 14 of parallel conductors 16A through 16G are aligned at an angle of −60° with the lattice translation axis. A bi-polar current source 17 is connected to array 10 at both ends of conductors 12A through 12G to form a circuit. Similarly, a bi-polar current source 20 is connected to array 14 at both ends of conductors 16A through 16G to form another circuit. The bi-polar current sources 17 and 20 are for example, two sinusoidal current sources, which are operated 90° out-of-phase. The connections to arry 10 and to array 14 are made in such a manner that the two circuits are electrically orthogonal in that all the conductors of array 10 run along equal potential lines of array 14 and vice versa. For example, conductors 16A through 16G intersect conductor 12C at points 26, 28, 30, 32, 34, 36 and 38. For any current I, these intersection points are at the same potential and no current is induced in conductor 12D. Similarly, conductors 12A through 12G intersect conductor 16C at points 44, 46, 30, 48, 50, 52 and 54. For any current $I_2$, these intersection points are at the same potential and no current is induced in conductor 16C.

In operation, current source 17 is activated to pass current through conductors 12A through 12G in a first direction. The next step is to pass current from current source 20 through conductors 16A through 16G in a second direction. The next step is to pass current from source 17 through through array 10 in a direction opposite to the first direction. The next step would be to pass current from current source 20 through array 14 in a direction opposite to the second direction. Performing these four steps will move the bubbles in a bubble lattice a distance $a_0$, the lattice constant. This will be shown more clearly hereinafter in the description of FIG. 3.

Figure 2:
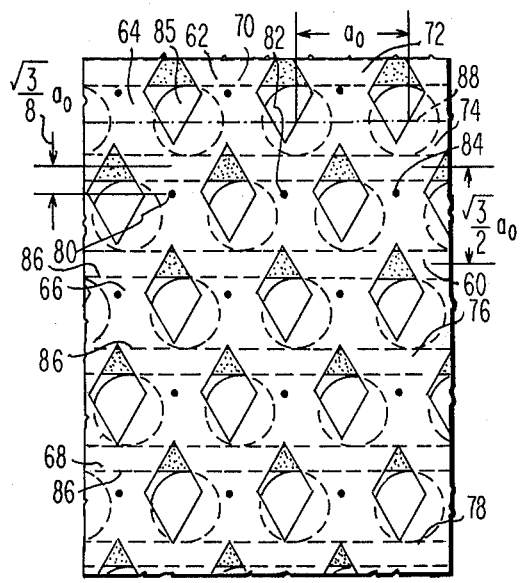
FIG. 2 is a top view illustrating the relative position of the bubbles, confining means and conductors in a preferred embodiment.

As shown in FIG. 2 conductors 60, 62, 64, 66 and 68 are arranged parallel to each other at an angle of −60° to the translation axis, i.e., the direction of translation. Conductors 70, 72, 74, 76 and 78 are arranged parallel to each other and are aligned at an angle of +60° to the translation axis. Conductors 62 through 68 cross conductors 70 through 78. The conductor width is such that when one conductor edge is located over the centerline of a bubble column, the other edge is located halfway between two adjacent bubble columns. The conductor width is thus equal to $$(m - \tfrac{1}{2}) \frac{\sqrt{3}}{2} a_0 ,$$

where $m$ is an integer $\geq 1$. The intersection formed where these conductors cross have an intersection midpoint, for example, 80, 82 and 84. The lattice contains a plurality of bubbles 85 positioned in rows between barriers 86. The barriers 86 may be dams, grooves, conductors or equivalent means. The position of the intersection midpoints, for example, 80, 82, 84 with respect to the bubble row position is important. Adjacent rows of bubbles are spaced a distance of $$\frac{\sqrt{3}}{2} a_0$$

apart. The distance between any intersection midpoint and a line drawn through the center of each bubble row, is equal to $$(4q + 3) \frac{\sqrt{3}}{8} a_0$$

where $a_0$ is the lattice constant and $q$ is an integer number. Bubble row positions relative to the conductor intersection midpoints are maintained by the confining means. For this purpose, the centerline through each confining means, such as a dam, for example, is located a distance of $$\frac{\sqrt{3}}{8} a_0$$

from an adjacent conductor intersection midpoint. The confining means may be spaced apart to include one to five rows of bubbles. Preferably, the confining means are spaced apart to include one row of bubbles as is shown in FIG. 2. The spacing of the conductors is $$n \frac{\sqrt{3}}{2} a_0$$

where $n$ is an integer $\geq 1$ and $n \geq m$. Preferably, the spacing of the conductors equals the spacing of 1 to 3 bubble columns and must be greater than the conductor width.

Figure 3B:
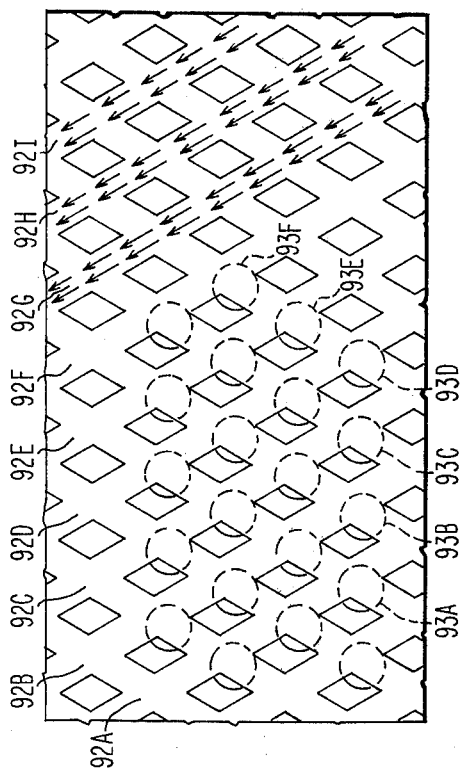
FIG. 3A–3D are top views of the embodiment shown in FIG. 2, illustrating the relative lattice positions for four directions of the applied current.
Figure 3D:
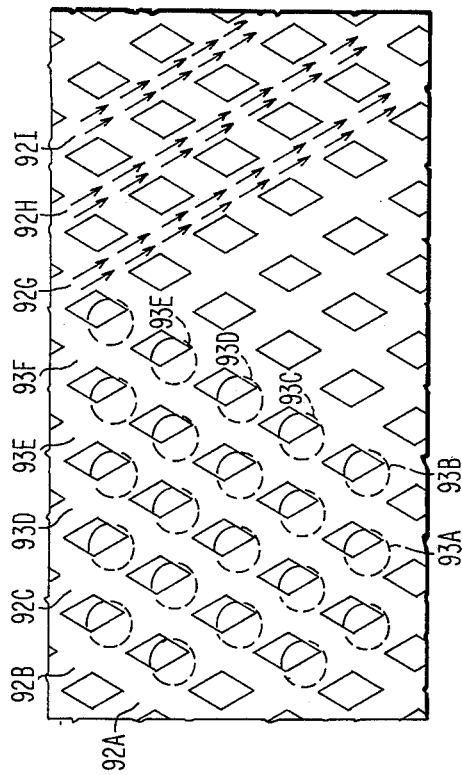
Figure 3A:
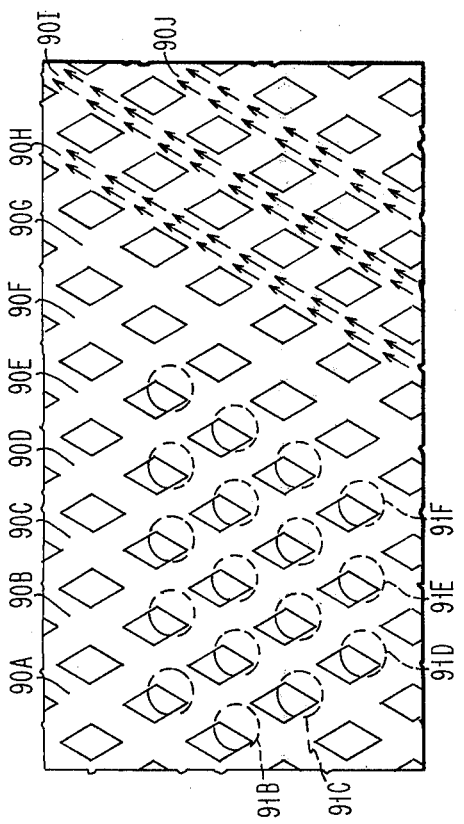

In FIGS. 3A through D the relative position of the bubbles with respect to the intersecting conductor arrays is shown for the four different directions that the current is applied. In FIG. 3A a current is passed upwardly through conductors 90A through 90J as shown in 90H, 90I and 90J to produce an attractive edge on the left side of these conductors and a repulsive edge on the right side of these conductors. The bubble columns 91A through 91I (91A, 91G, 91H and 91I not shown) are parallel to conductors 90A through 90I and are at an angle of +60° to the translation axis. The lattice translates until the bubble columns 91A through 91I are centered under the attractive edge (the left side) of conductors 90A through 90I respectively. The repulsive edge (the right side) of conductors 90A through 90I are located adjacent bubble columns 91A through 91I.

In FIG. 3B a current is passed upwardly through conductors 92A through 92I as shown in 92G, 92H and 92I to produce an attractive edge on the left side of these conductors and a repulsive edge on the right side of the conductors. The bubble columns 93A through 93I (93G, 93H and 93I not shown) are parallel to conductors 92A through 92I and are at an angle of −60° to the translation axis. The lattice translates until the bubble columns 93A through 93I are centered under the attractive edge (the left side) of conductors 92A through 92I respectively. The repulsive edge (the right side) of conductors 92A through 92I are located between adjacent bubble columns 93A through 93I.

Figure 3C:
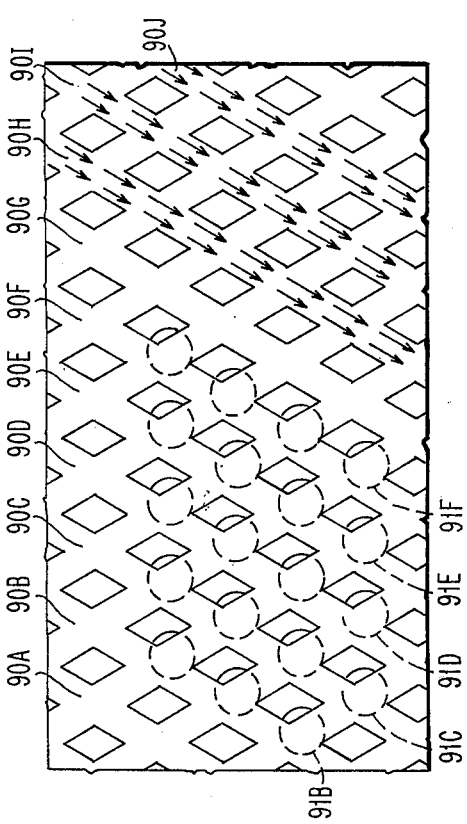

In FIG. 3C a current is passed downwardly through conductors 90A through 90J as shown in 90H, 90I and 90J to produce an attractive edge on the right side of these conductors and a repulsive edge on the left side of these conductors. The bubble columns 91A through 91I (91A, 91G, 91H and 91I not shown) are parallel to conductors 90A through 90I and are at an angle of +60° to the translation axis. The lattice translates until the bubble columns 91A through 91I are centered under the attractive edge (the right side) of conductors 90A through 90I respectively. The repulsive edge (the left side) of conductors 90A through 90I are located between adjacent bubble columns 91A through 91I.

In FIG. 3D a current is passed downwardly through conductors 92A through 92I as shown in 92G, 92H and 92I to produce an attractive edge on the right side of these conductors and a repulsive edge on the left side of these conductors. The bubble columns 93A through 93I (93G, 93H and 93I not shown) are parallel to conductors 92A through 92I and are at an angle of −60° to the translation axis. The lattice translates until the bubble columns 93A through 93I are centered under the attractive edge (the right side) of conductors 92A through 92I respectively. The repulsive edge (the left side) of conductors 92A through 92I are located between adjacent bubble columns 93A through 93I.

As shown in FIG. 3A–3D, the bubbles are moved a distance, $a_0$, toward the right side of the array pattern when the current is sequentially passed through the conductors in a counter-clockwise mode. The bubbles are moved toward the left side when a clockwise mode is used (not shown).

Figure 4:
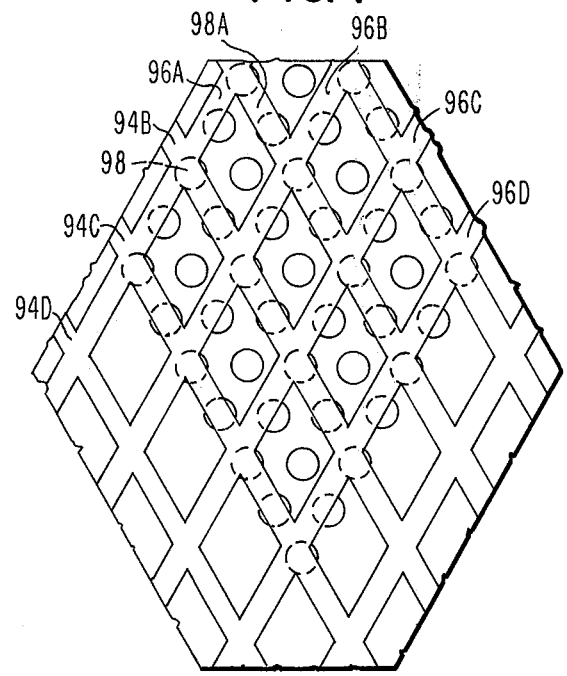
FIG. 4 is a top view of a second embodiment.

In FIG. 4 the conductors 94A, 94B, 94C and 94D are spaced apart $2a_0$. Similarly, the conductors 96A, 96B, 96C and 96D are spaced $2a_0$. The relative position of the bubbles 98 in the bubble lattice with respect to the conductors 94A through 94D and 96A through 96D is shown. In this figure a driving force is exerted on 50% of all the bubbles 98 at a particular time. Translation of the lattice as a whole relies on bubble-bubble interactions.

The translation scheme described above provides two circuits electrical orthogonal to each other. All current conductors of one circuit run along equal potential lines of the other circuit and vice versa. The system or scheme provides a number of advantages not found in the prior art translation schemes. Some of these advantages are as follows. Since all the conductors are connected in parallel, there is a low input impedance. This is a distinct advantage over the high input impedance of serially connected connectors. Another advantage is that the drive scheme works even if there are discontinuities in some of the conductors. This greatly increases the yield. This simplified structure also permits single plane metallurgy to be employed. Still another advantage is that the drive scheme employs distributed rather than localized drive and as a result reduces lattice distortion, power consumption and minimizes localized heating.

The driving forces alternate in skew angle symmetrically about the translation axis and are not applied at a fixed skew angle as is the case in prior art systems.

EXAMPLE

In one example, a device was fabricated on a EuYIG wafer, having a film thickness of 3.6 μm, a saturation magnetization of 181 gauss and a characteristic length of 0.6μm. For confinement, a surface topography consisting alternately of 3μm wide dams and 7μm wide grooves was sputter etched to a depth of 0.5μm. Electroplated gold conductors were 1μm thick and spaced from the garnet film by a 0.6μm thick SiO separation layer. Conductor width = ;b 5μm with a center to center conductor separation of 10μm (like FIG. 3). Reliable lattice translation was obtained with a drive current of 5mA per conductor.

Although several preferred embodiments of this invention have been described, it is understood that numerous variations may be made in accordance with the principles of this invention.

What is claimed is:

1. A combination suitable for the translation of a bubble lattice having a lattice constant, $a_0$, comprising
   confining means which define a lattice translation axis and adapted to restrict bubble motion perpendicular to said axis,
   a first array of parallel first conductors positioned at an angle of 60° to the lattice translation axis and connected to a first current source, and
   a second array of parallel second conductors positioned in the same plane as said first array at an angle of −60° to said axis and connected to a second current source.

2. A combination as described in claim 1 wherein the number of said first conductors is substantially the same as the number of said second conductors.

3. A combination as described in claim 1 wherein the width of said first conductors is $$(m - \tfrac{1}{2}) \frac{\sqrt{3}}{2} a_0$$

where $m \geq 1$.

4. A combination as described in claim 1 wherein the spacing of said first conductors is $$n \frac{\sqrt{3}}{2} a_0$$

where $n$ is an integer $\geq 1$ and $n \geq m$.

5. A combination as described in claim 1 wherein the spacing between said first conductors is a distance taken from the group consisting of $$\frac{\sqrt{3}}{2} a_0 \text{ and } 3 \frac{\sqrt{3}}{2} a_0.$$

6. A combination as described in claim 1 wherein the connections between said first current source and said first conductor array are such that equipotential lines of the resulting circuit are parallel to the conductors of said second array.

7. A combination as described in claim 5 wherein the connections between said second current source and said second conductor array are such that equipotential lines of the resulting circuit are parallel to the conductors of said first array.

8. A combination suitable for the translation of a bubble lattice having a lattice constant, $a_0$, comprising confining means which define a lattice translation axis and adapted to restrict bubble motion perpendicular to said axis, a first array of parallel first conductors positioned at an angle of 60° to the lattice translation axis, said first conductors being spaced apart a distance taken from the group consisting of $$\frac{\sqrt{3}}{2} a_0 \text{ and } 3 \frac{\sqrt{3}}{2} a_0$$

said first conductors being connected to a first current source to form a first line of connections, and a second array of parallel second conductors positioned in the same plane as said first array at an angle of −60° to the lattice translation axis and parallel to said first line of connections, said second conductors being spaced apart substantially the same distance as said first conductors, said second conductors being connected to a second current source to form a second line of connections, said second line of connections being parallel to said first conductors.

9. A combination as defined in claim 8 wherein said confining means are spaced apart to include 1 to 5 rows of bubbles.

10. A combination as defined in claim 8 wherein said confining means are positioned between all of the rows in said lattice and spaced apart $$\frac{\sqrt{3}}{2} a_0.$$

11. A combination as defined in claim 8 wherein a line drawn through the centers of said confining means are positioned $$\frac{\sqrt{3}}{8} a_0$$

from the conductor intersections.

* * * * *